(12) United States Patent
Nguyen et al.

(10) Patent No.: US 6,801,585 B1
(45) Date of Patent: Oct. 5, 2004

(54) MULTI-PHASE MIXER

(75) Inventors: Thai M. Nguyen, San Jose, CA (US); Pengfei Zhang, Fremont, CA (US)

(73) Assignee: RF Micro Devices, Inc., Greensboro, NC (US)

( * ) Notice: Subject to any disclaimer, the term of this patent is extended or adjusted under 35 U.S.C. 154(b) by 703 days.

(21) Appl. No.: 09/690,698

(22) Filed: Oct. 16, 2000

(51) Int. Cl.$^7$ ............................. H03D 3/18; H03D 3/24
(52) U.S. Cl. .................... 375/327; 455/130; 455/180.3; 375/359; 375/374
(58) Field of Search ............................. 375/316, 327; 327/359, 356; 328/93

(56) References Cited

U.S. PATENT DOCUMENTS

| | | | | |
|---|---|---|---|---|
| 3,705,357 A | * | 12/1972 | Carter et al. .................. 326/52 |
| 4,612,585 A | | 9/1986 | Takase et al. ................ 358/316 |
| 4,766,497 A | | 8/1988 | Banach et al. ............... 358/188 |
| 5,479,112 A | * | 12/1995 | Choi et al. ..................... 326/34 |
| 5,635,892 A | | 6/1997 | Ashby et al. ................ 336/200 |
| 5,736,749 A | | 4/1998 | Xie ................................. 257/3 |
| 5,745,838 A | | 4/1998 | Tresness et al. ............. 455/5.1 |
| 6,008,102 A | | 12/1999 | Alford et al. ................ 438/381 |
| 6,031,432 A | | 2/2000 | Schreuders ............... 333/24 R |
| 6,194,947 B1 | * | 2/2001 | Lee et al. ..................... 327/359 |
| 6,211,708 B1 | * | 4/2001 | Klemmer ..................... 327/122 |
| 6,735,238 B1 | * | 5/2004 | McCorkle .................... 375/130 |

OTHER PUBLICATIONS

CMOS digital integrated circuits; Sung–Mo kang, Yusef Leblebici□□Mcgraw–Hill, Copyright 1999 ISBN: 0072925078□□□□.*

Introduction to Logic Design; Shiva, Sajjan G. New York, N.Y. Marcel Dekker, Inc., 1998. □□ISBN: 0824700821 eBook ISBN: 0585182086 □□Subject: Digital electronics. Logic design.*

R Nave(http://hyperphysics.phy–astr.gsu.edu/hbase/electronic/xor.html).*

Lam, C. and Razavi, B., "A 2.6–GHz/5.2–GHz Frequency Synthesizer in 0.4–µm CMOS Technology", *IEEE Journal of Solid–State Circuits*, vol. 35, No.5, May 2000, pp. 788–794.

Rategh et al., "A CMOS Frequency Synthesizer with an Injection–Locked Frequency Divider for a 5–GHz Wireless LAN Receiver", *IEEE Journal of Solid–State Circuits*, vol. 35, No. 5, May 2000, pp. 780–787.

Samavati et al., "5–GHz CMOS Wireless LAN Receiver Front End", *IEEE Journal of Solid–State Circuits*, vol. 35, No. 5, May 2000, pp. 765–772.

Wong et al., "A Wide Turning Range Gated Varactor", *IEEE Journal of Solid–State Circuits*, vol. 35, No. 5, May 2000, pp. 773–779.

Liu T. and Westerwick, E., "5–Ghz CMOS Radio Transceiver Front–End Chipset", *IEEE Journal of Solid–State Circuits*, vol. 35, No. 12, Dec. 2000, pp. 1927–1941.

Steyaert et al., "A 2–V CMOS Cellular Transceiver Front–End", *IEEE Journal of Solid–State Circuits*, vol. 35, No. 12, Dec. 2000, pp. 1895–1907.

* cited by examiner

*Primary Examiner*—Stephen Chin
*Assistant Examiner*—Harry Vartanian
(74) *Attorney, Agent, or Firm*—Withrow & Terranova, PLLC (57) ABSTRACT

A wireless receiver apparatus including a voltage controller oscillator and mixer. The voltage controlled oscillator generates a first signal having a first frequency, and a second signal having the first frequency. The first and second signals are in quadrature. The mixer has a first input port for receiving the first signal, and a second input port for receiving the second signal, a third input port for receiving a third signal at a frequency centered about a third frequency. The mixer generates a fourth signal having a frequency centered about a fourth frequency which is equal to the third frequency less twice the first frequency.

7 Claims, 11 Drawing Sheets

| A B | A⊕B | Ā·B̄ | Ā·B | A·B̄ | Ā·B̄+A·B |
|-----|-----|-----|-----|-----|---------|
| 0 0 | 0   | 1   | 0   | 0   | 1       |
| 0 1 | 1   | 0   | 1   | 0   | 0       |
| 1 0 | 1   | 0   | 0   | 1   | 0       |
| 1 1 | 0   | 0   | 0   | 0   | 1       |

Figure 6A $A \oplus B = \bar{A} \cdot B + A \cdot \bar{B}$ $\overline{A \oplus B} = \overline{\bar{A} \cdot B + A \cdot \bar{B}}$

$\overline{A \oplus B} = \overline{\bar{A} \cdot B} \cdot \overline{A \cdot \bar{B}}$ $\overline{A \oplus B} = (A + \bar{B}) \cdot (\bar{A} + B)$ $\overline{A \oplus B} = A \cdot \bar{A} + A \cdot B + \bar{A} \cdot \bar{B} + B \cdot \bar{B}$ $\overline{A \oplus B} = A \cdot B + \bar{A} \cdot \bar{B}$

MULTI-PHASE MIXER

BACKGROUND OF THE INVENTION

The present invention relates to mixers for use in wireless transceivers, specifically a multi-phase mixer.

The field of wireless technology is currently undergoing a revolution, and is experiencing exponential growth. Cell phones, once considered a novelty and referred to as "car phones" are now ubiquitous, and cordless phone in the home are commonplace. A whole new batch of wireless personal digital assistants, and Bluetooth enabled computer peripherals are now entering the market, with wireless internet access as a driving force. A multi-phase mixer is described which will facilitate the design and lower the cost of circuits for these and related products.

Wireless devices typically transmit and receive data through the air on high frequency electromagnetic waveforms, though some systems, such as satellite dishes and pagers simply receive, and others merely transmit. Data transmission is begun by encoding the data to be transmitted. This encoded data typically has a data rate of 100 kHz to 100 MHz and modulates a high frequency carrier signal. The carrier signal is often in the 2–10 GHz range. The modulated carrier signal is then applied to an antenna for broadcasting. The broadcast signal is referred to as a radio frequency (RF) signal. Reception involves receiving the RF signal on a different antenna, and filtering undesired spectral components. The signal is demodulated, filtered again, and decoded.

It is very difficult to handle and generate these high frequency carrier and RF signals. Accordingly, receivers and transmitters are designed to have a minimum amount of circuitry operating at or near these rates. Transmitters are set up to modulate the carrier with the data right at the antenna. Receivers are organized to demodulate the RF to the data rate as soon in the signal path as possible.

Exacerbating this is the competitive nature of the wireless marketplace itself, which puts tremendous pricing pressure on systems manufacturers. Much of the system is on at least one integrated circuit, and that integrated circuit's price can be reduced by producing it using a comparatively inexpensive process. For optimal savings, a process no better than what is required to make a properly functioning circuit is used. The practical aspect of this is that devices handling the carrier frequency are operating above their $f_{beta}$ and near their unity gain frequency $f_T$. In other words, the transistors in the integrated circuit have low gain and don't operate much like transistors at these frequencies. What is needed are methods and circuits for the modulation and demodulation of carrier signals that can alleviate these difficulties at high frequency.

CONVENTIONAL RECEIVERS AND MIXERS

Figure 1:
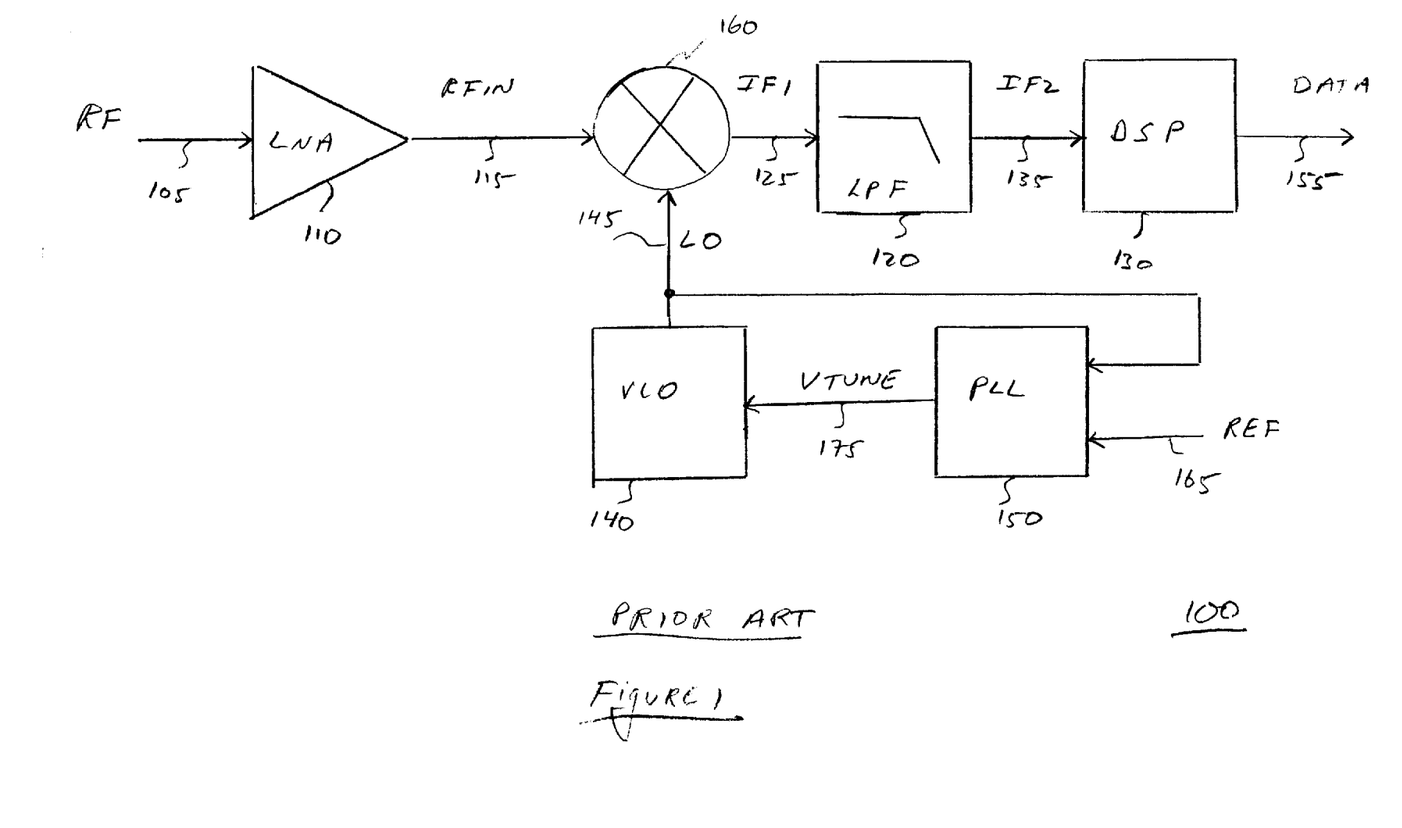
FIG. 1 illustrates a conventional wireless receiver front end.

FIG. 1 is a block diagram of a conventional receiver 100 for use in wireless systems. Specifically, a direct conversion receiver is represented. It may also be referred to as a low IF (intermediate frequency), zero IF, or hoinodyne receiver. Included is a low noise amplifier (LNA) 110, a modulator or mixer 160, low pass filter (LPF) 120, digital signal processor (DSP) 130, voltage controlled oscillator (VCO) 140, and phase lock loop (PLL) 150. The PLL 150 includes a frequency synthesizer, phase-frequency detector, and loop filter. A variable gain amplifier (VGA) may also be included. The DSP 130 includes an analog to digital converter (A/D).

The RF signal is received on an antenna coupled to line 105. A choke filter may be used to remove unwanted spectral portions from the reception characteristics of line 105. The RF signal is amplified by LNA 110, and provided to the mixer 160. LNA 110 may be a composite of more than one amplifier, for example a second LNA may be on a chip with the other blocks shown, while a first LNA may be off-chip. A VCO 140 generates a local oscillator (LO) signal on line 145, and provides it to the mixer 160 and PLL 150. The VCO may be on-chip or off-chip; alternately it may have its transistors on-chip, with some passive components external.

The mixer 160 multiplies the RFin signal on line 115 with the LO signal on line 145. The mixer 160 outputs a signal on line IF1 125, which has spectral components at the two frequencies which are the sum and difference of the RFin and LO signals. Specifically, if the RFin and LO frequencies are both 2.4 GHz, IF1 125 has components at DC (0 Hz) and 4.8 GHz.

LPF 120 filters the high frequency sum products of IF1 while passing the low frequency difference components. A VGA may be used at this point to adjust the signal amplitude. The A/D converter in the DSP 130 digitizes the data, and DSP 130 decodes the data, and provides an output on line 155. The DSP 130 provides feedback in the form of a digital signal, which is converted to an analog signal for controlling the gain of the VGA. PLL 150 provides the voltage which controls the VCO 140's oscillation frequency. The control voltage is Vtune, and is output from the PLL 150 to the VCO 140 on line 175. The PLL 150 divides the LO signal on line 145 and compares that to a reference frequency (REF) provided on line 165. The LO frequency is adjusted accordingly.

Figure 2:
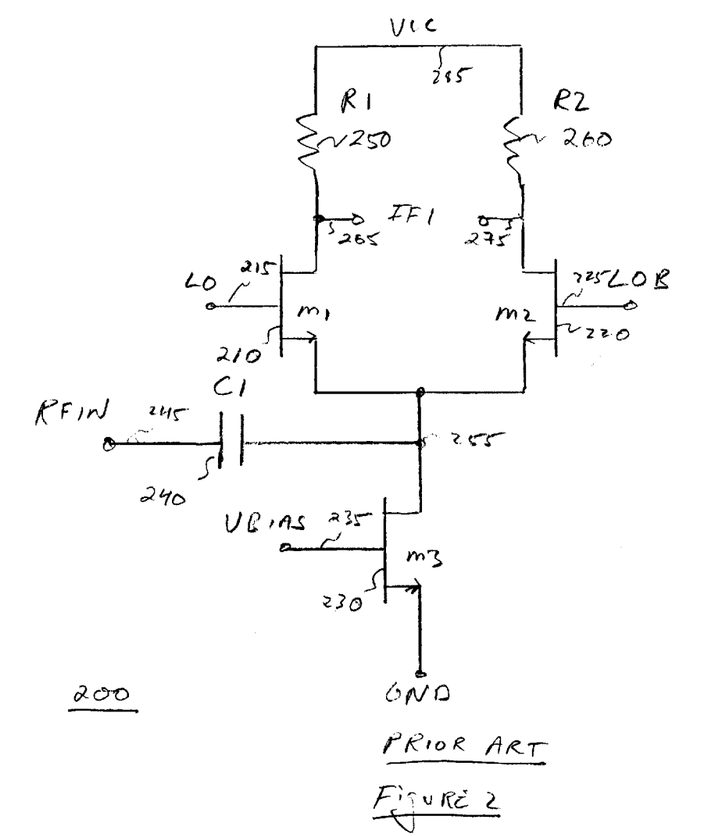
FIG. 2 shows a conventional mixer.

A conventional mixer circuit 200 used in similar receivers is shown in FIG. 2. The mixer has a first input port 245 labeled RFin, a second differential input port for receiving the LO signal and its complement LOS on lines 215 and 225, and a differential output on lines 265 and 275. Voltage changes at RFin generate a current in capacitor C1 240. This current modulates the tail current provided by M3 230 under the control of the bias voltage on node 235. This RFin modulated current is then multiplied in the mixer core M1 210 and M2 220, resulting in the IF1 output on the lines 265 and 275; 1he output IF1 will have two frequency components, one at the sum of the frequency of the RFin and LO signals, and one at the difference.

In the receiver of FIG. 1, the LNA 110, mixer 160, VCO 140, and frequency synthesizer portion of the PLL operate at or near the RF frequency. This leads to three difficulties. First, a large amount of the circuitry is running at high frequencies near their transistor's $f_T$. Second, the LO signal on line 145 induces a signal on the RF line 105, which is amplified by the LNA 110, and mixed with the LO itself in mixer 160. This is referred to as LO leakage. The result is a DC voltage which appears as a DC offset at IF1 on line 125. Third, the RF signal leaks onto the VCO, particularly at the point where external components may be connected. As the RF signal changes frequency, the VCO frequency tries to change. This is known as VCO pulling.

What is needed is a design innovation which would enable the use of comparatively inexpensive technology while still achieving the desired performance and solving the above problems. SUMMARY OF THE INVENTION Accordingly, mixer circuits which reduce the amount of circuitry operating at or near the carrier frequency are disclosed. The mixer circuits also mitigate the LO-leakage and VCO-pulling problems.

In one embodiment, the present invention provides a wireless receiver apparatus including a VCO and mixer. The VCO provides a first signal having a first frequency, and a second signal having the first frequency. The first and second signals are in quadrature. The mixer has a first input port for receiving the first signal, and a second input port for receiving the second signal, a third input port for receiving a third signal centered about a third frequency. The mixer generates a fourth signal having a frequency centered about the third frequency less twice the first frequency.

In another embodiment, the present invention provides a mixer including a first port for receiving a first signal having a first frequency; a third port for receiving a third signal having a third frequency; and a fourth port for outputting a fourth signal having a fourth frequency. A mixer core for doubling the first frequency of the first signal and multiplying the first signal with the third signal is also included.

The mixer may also have a second port for receiving a second signal wherein the second signal is skewed relative to the first signal. In one embodiment the skew between the first and second signals is approximately 90 degrees.

In yet another embodiment, the present invention provides a method of mixing signals including providing a first signal at a first frequency, providing a second signal at the first frequency, the second signal skewed from the first, and providing a third signal modulated about a third frequency. The first signal and the second signal are exclusive-ORed, and multiplied with the third signal. The method may further include outputting a fourth signal at a frequency equal to the third frequency less twice the first frequency.

BRIEF DESCRIPTION OF THE DRAWINGS

FIG. 3 is a receiver using a frequency doubler;

DESCRIPTION OF THE SPECIFIC EMBODIMENTS

Frequency Doubling

FIG. 3 illustrates a receiver front end 300 consistent with one embodiment of the present invention. The receiver 300 includes an LNA 110, mixer 160, LPF 120, DSP 130, VCO 140, frequency doubler 310, and PLL 150. The PLL 150 includes a frequency synthesizer, phase frequency detector, and loop filter. A variable gain amplifier (VGA) may also be included. The DSP 130 includes an analog to digital converter (A/D).

As in FIG. 1, the RF signal is received on an antenna coupled to line 105. A choke filter may be used to remove unwanted spectral portions of the received signal. The RF signal is amplified by LNA 110, and provided to the mixer 160. The VCO provides an output signal Vcoout on line 305 to the frequency doubler 310 and PLL 150. The Vcoout frequency may be about half the RF-signal frequency. Alternately, the frequency may be less than, or more than half the RF signal frequency. The frequency doubler 310 provides an LO signal at the carrier frequency, on line 145 to the mixer 160, by doubling the Vcoout frequency.

The mixer 160 multiplies the RFin signal on line 115 with the LO signal on line 145. Alternately, the mixer may be an image reject mixer. The mixer outputs a signal on line IF1 125, which has spectral components at the two frequencies which are the sum and difference of the RFin and LO signals. LPF 120 filters the sum products of IF1 while passing the low frequency difference components. The bandwidth limitations of the mixer circuit itself also acts as a low pass filter and help reject the sum products. A VGA can be used to adjust the gain, and the A/D in DSP 130 digitizes the waveform. The DSP 130 decodes the data, and provides an output on line 155. The control voltage Vtune from the PLL to the VCO on line 175 controls the oscillation frequency. The PLL compares the Vcoout signal on line 305 to the REF signal provided on line 165, and adjusts Vcoout to the correct frequency. Typically the REF signal frequency is much lower than the VCO frequency. The VCO frequency is divided down in the frequency synthesizer before the phase or frequency comparison is made.

Using this architecture, the VCO 140 and frequency synthesizer in the PLL 150 do not need to run at the carrier frequency. Rather, these circuits need operate only at half the carrier rate. In this implementation, only the LNA 110, mixer 160, and frequency doubler 310 switch at the high frequency.

Furthermore, the VCO 140 now operates near half the RFin frequency. VCO leakage appears on line 105, and is mixed with the LO. For example, if the RFin frequency is 10 GHz, and Vcoout is 5 GHz, the VCO-leakage mixer products are at the sum −15 GHz- and difference −5 GHz-. But both may easily be filtered by the LPF 120, therefore, the problem caused by VCO leakage is reduced. Also, the RFin frequency is at the second harmonic of the VCO frequency. Even harmonics do not tend to pull a VCO as well as the fundamental or odd harmonics do. Accordingly, the VCO pulling problem is also mitigated using this topology.

Frequency Doubling using XOR gates

Figure 4A:
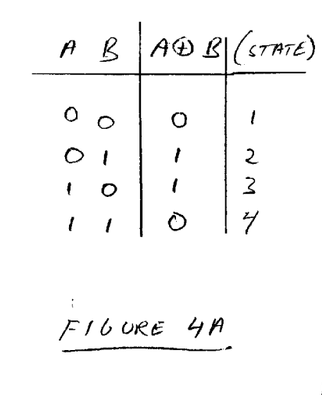
FIG. 4A is the truth table for an XOR function.

FIG. 4A is a truth table for an exclusive OR (XOR) gate. A two input XOR gate has a high output if and only if one input is high. If both inputs are high, or both are low, the XOR output is low. The truth table has four states, 1–4, as labeled in the right column.

Figure 4B:
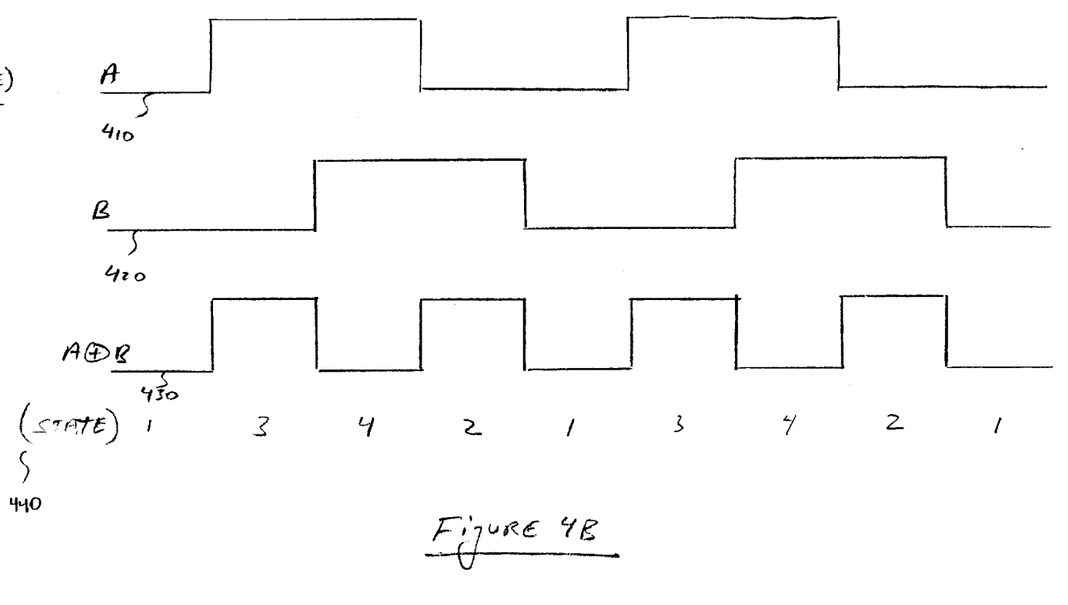
FIG. 4B illustrates two signals in quadrature along with their XOR product.

FIG. 4B illustrates how an XOR gate may be used as a frequency doubler. A periodic signal A 410 is provided. Signal A 410 alternates between a first voltage level and a second voltage level, which may be referred to as a low and high level, or a 0 and 1 level. A signal B 420 is provided. Signal B 420 follows A 410 by one fourth of a cycle, which is 90 degrees or pi/2 radians. Signals A 410 and B 420 are said to be in quadrature with each other. If A 410 and B 420 are considered as vectors in polar coordinate space, they are at right angles. Signals A 410 and B 420 are shown as square waves for simplicity. Alternately, they may be sine waves, or waveforms with duty cycles other than 50%. Also, they need not be in quadrature; the principle applies with B 420 delayed by any amount between 0 and 180 degrees. For example, A and B may be skewed by 85 degrees.

The XOR between signals A 410 and B 420 yields waveform 430. The XOR value at any time corresponds to the state given on line 440. States on line 440 correspond to entries in the right column of FIG. 4A. As can be seen, waveform 430 completes one cycle for every half cycle of A 410. Therefore, waveform A⊕B 430 has a frequency twice that of A 410 or B 420. If B 420 is delayed relative to A 410 by other than 90 degrees, A⊕B 430 would still be at twice the frequency, but would not have a 50% duty cycle. For example, if B 420 followed A 410 by 45 degrees, A⊕B 430 would have a 25% duty cycle. In that case, the waveform would be high 25% of the time, and low otherwise. This would give the mixer less time to react to a high. Because of this, performance is optimized if the signal vectors are close to being at right angles.

Figure 5:
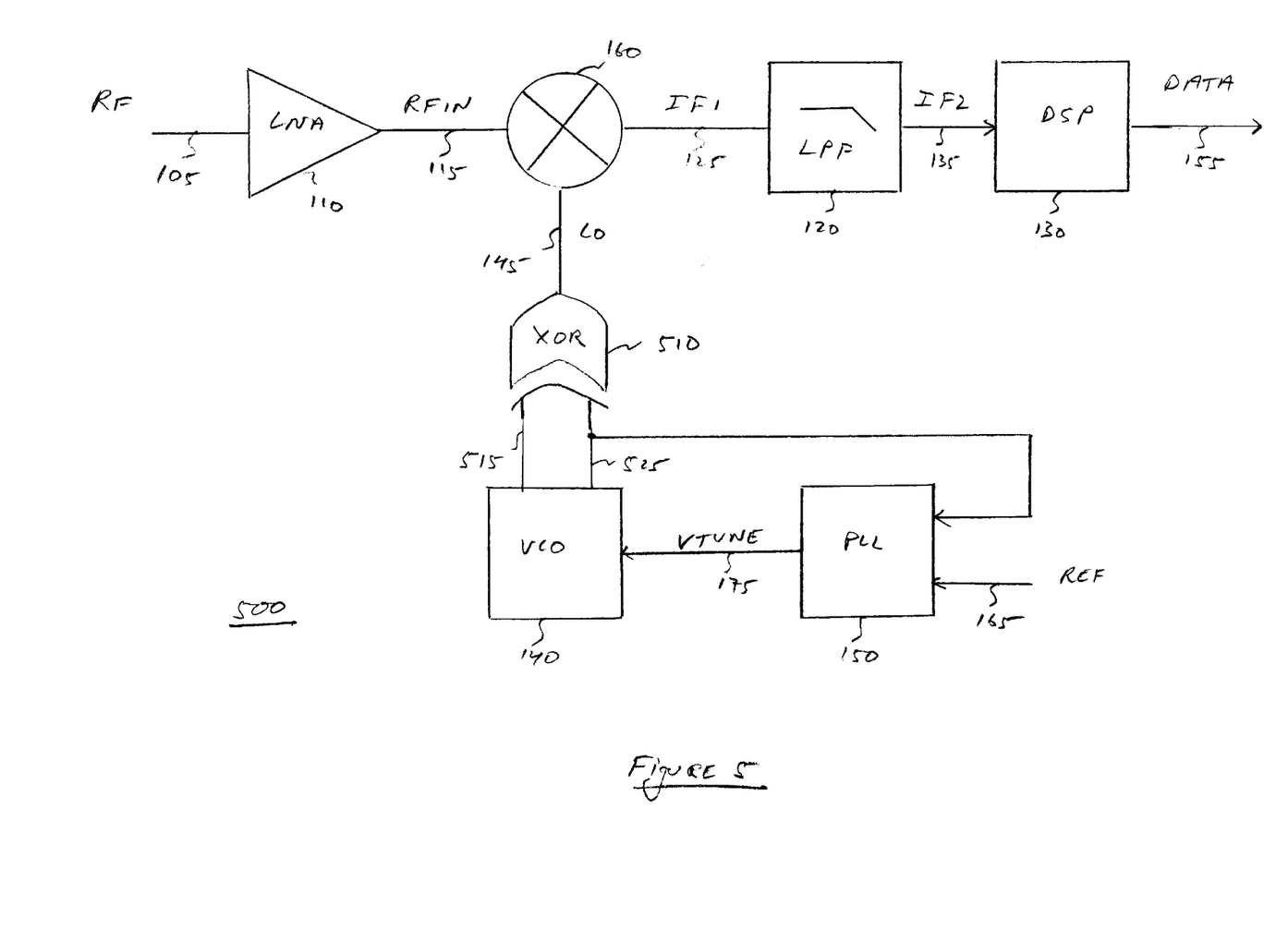
FIG. 5 is a block diagram of a wireless receiver using an XOR gate as a frequency doubler according to one embodiment of the present invention.

FIG. 5 illustrates a receiver front end 500 using an XOR gate as a frequency doubler consistent with one embodiment of the present invention. The receiver 500 includes an LNA 110, mixer 160, LPF 120, DSP 130, VCO 140, XOR gate 510, and PLL 150. The PLL 150 includes a frequency synthesizer, phase-frequency detector, and loop filter. A variable gain amplifier (VGA) may also be included. The DSP 130 includes an analog to digital converter (A/D).

As before, the RF signal is received on an antenna coupled to line 105. The RF signal is amplified by LNA 110, and provided to the mixer 160. The VCO provides a first output signal on line 515, and a second output signal on line 525 in quadrature with the first. These outputs couple to the XOR gate 510. Typically one of the two couples to PLL 150, with the other coupling to a dummy load such that parasitic skew is not introduced. The frequency of the signals at the VCO output are half the frequency of the RF signal. XOR gate 510 provides an LO signal at the carrier frequency, on line 145 to the mixer 160.

Again, the mixer 160 multiplies the RFin signal on line 115 with the LO signal on line 145. The mixer outputs a signal on line IF1 125, which has spectral components at the two frequencies which are the sum and difference of the RFin and LO signals. LPF 120 filters the sum products of IF1 while passing the low frequency difference components. A VGA may be used to adjust the amplitude of the signal at this point. An A/D converter in DSP 130 digitizes the signal IF2 on line 135, and DSP 130 decodes and provides the data on line 155. The control voltage Vtune from the PLL to the VCO on line 175 controls the frequency of oscillation.

Using this architecture, the VCO 140 and frequency synthesizer in the PLL 150 need operate only at half the carrier rate. In this implementation, only the LNA 110, mixer 160, and XOR gate 510 switch at the high frequency.

As with the generic frequency doubler above, the VCO 140 operates near half the frequency of RFin. VCO leakage appears on line 105, and are mixed with the LO. The VCO-leakage mixer products are at the sum and difference of the signals respective frequencies. But both of these frequencies are easily filtered by the LPF 120, so the problem caused by VCO leakage is reduced. Also, the frequency of RFin is at the second harmonic of the VCO frequency, thereby mitigating the VCO pulling problem.

The signals in this and the above block diagrams are shown as single ended, however, each of them may be differential. In one embodiment, the incident and quadrature signals from the VCO 140 are differential. Differential signals have a first portion and a second portion which is the complement of the first portion. In other words, the second portion is the inverse of the first portion. In another embodiment VCO 140 includes two cross connected differential pairs with on-chip spiral-inductor loads. Such an arrangement has two output differential signals that are in quadrature. Note that the tuning voltages and RF signal from the antenna are likely to be single ended lines. Differential signals may be generated by applying a single ended signal to the input of an inverter gate. The input and output of the inverter will be differential.

Alternate Expressions for the XOR gate

Figure 6A:
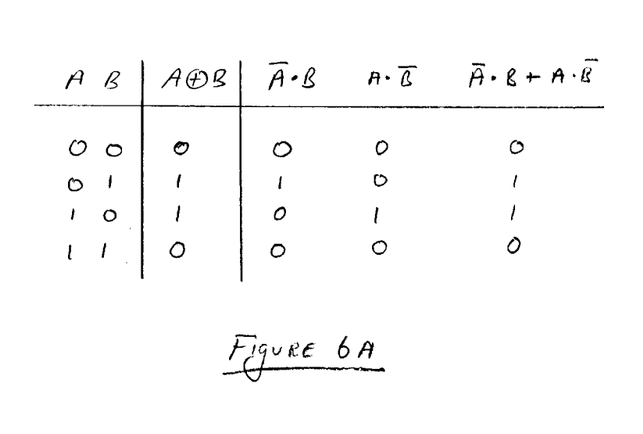
FIG. 6A is a table showing an alternate expression for an XOR function.
Figure 6B:
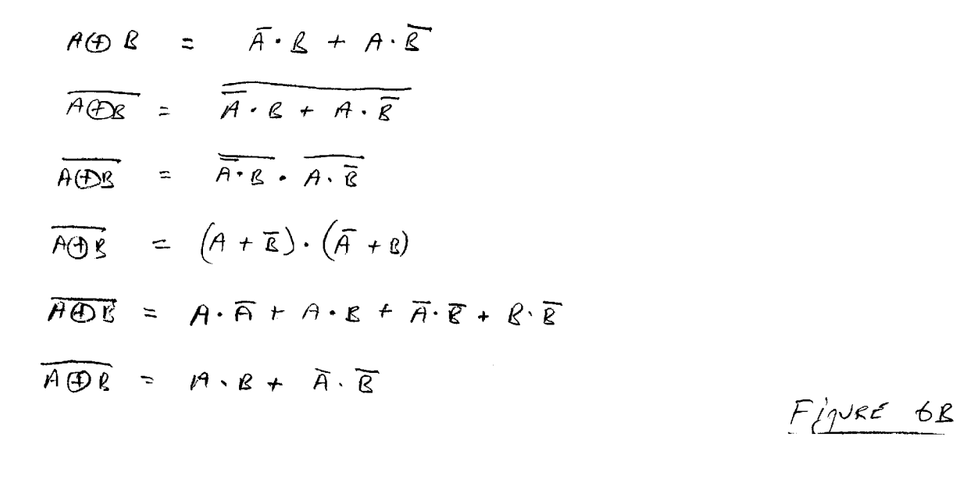
FIG. 6B provides equations for finding an alternate expression for the complement of an XOR function.

FIG. 6A is a truth table showing an equivalent expression for A⊕B. Specifically, an XOR function can be deconstructed into the OR of two ANDs. FIG. 6B finds an equation for the complement of an XOR, for use in generating differential XOR outputs. The complement of the XOR function can also be deconstructed into the OR of two ANDs.

Figure 7:
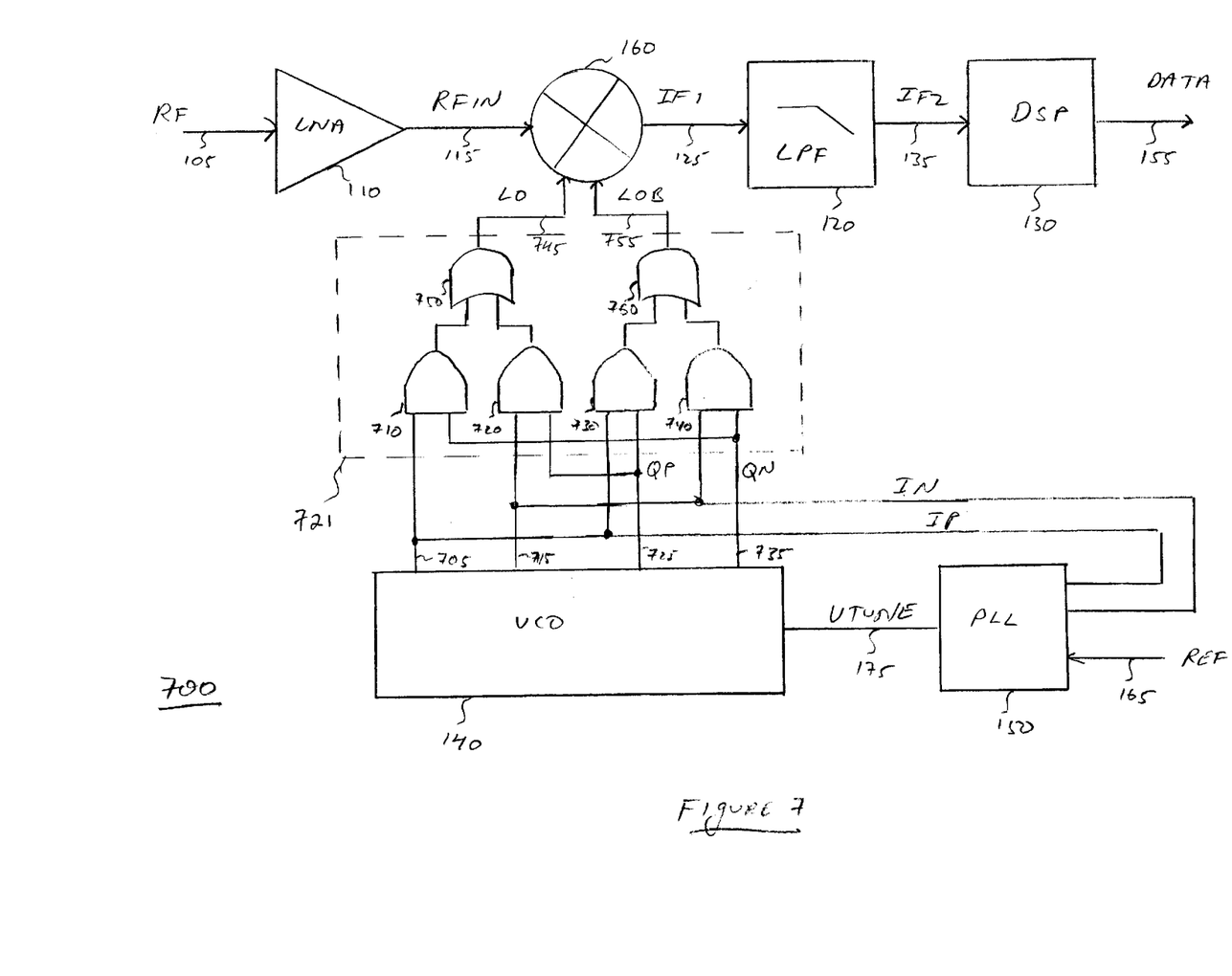
FIG. 7 depicts a block diagram of a wireless receiver implementing the expressions in FIGS. 6A and 6B for the frequency doubler according to one embodiment of the present invention.

FIG. 7 illustrates yet another receiver front end 700. This one uses AND along with OR gates to form a frequency doubler 721 consistent with one embodiment of the present invention. The receiver includes an LNA 110, mixer 160, LPF 120, DSP 130, VCO 140, and PLL 150. Frequency doubler 721 is made up of AND gates 710, 720, 730, 740, and OR gates 750 and 760. The PLL 150 includes a frequency synthesizer, phase-frequency detector, and loop filter. A variable gain amplifier (VGA) may also be included. The DSP 130 includes an analog to digital converter (A/D).

An RF signal is received on an antenna coupled to line 105. The RF signal is amplified by LNA 110, and provided to the mixer 160. The VCO provides a first output signal IP on line 705, and a second output signal QP on line 725 in quadrature with the first. Complementary outputs IN and QN are provided on lines 715 and 735 respectively, such that 705 and 715, and 725 and 735 are differential signals. These outputs each couple to two AND gates 710, 720, 730, and 740. IP and IN couple to PLL 150, with QP and QN coupling to a dummy load such that skew is not introduced. Alternately these couplings may be reversed. The frequency of the signals at the VCO output are half the frequency of the RF signal. OR gates 750 and 760 provide a differential LO signal LO an LOB at the carrier frequency, on lines 745 and 755.

The mixer 160 multiplies the RFin signal on line 115 with the LO signal on line 745. The mixer outputs a signal on line IF1 125, which has spectral components at the two frequencies which are the sum and difference of the RFin and LO signals. LPF 120 filters the sum products of IF1 while passing the low frequency difference components. A VGA may adjust the signal amplitude. The A/D converter in DSP 130 digitizes the data, and DSP 130 decodes and provides the data on line 155. The control voltage Vtune from the PLL to the VCO on line 175 controls the oscillation frequency.

Using this architecture, the VCO 140 and frequency synthesizer in the PLL 150 need operate only at half the carrier rate. In this implementation, only the LNA 110, mixer 160, and doubler 721 switch at the high frequency.

Again, the VCO 140 operates near half the RFin frequency, so the problem caused by VCO leakage is reduced. Also the VCO pulling problem is mitigated. The AND gates 710, 720, 730, and 740, and OR gate 750 and 760 implement the XOR and XOR complement functions of FIGS. 6A and 6B.

Figure 8A:
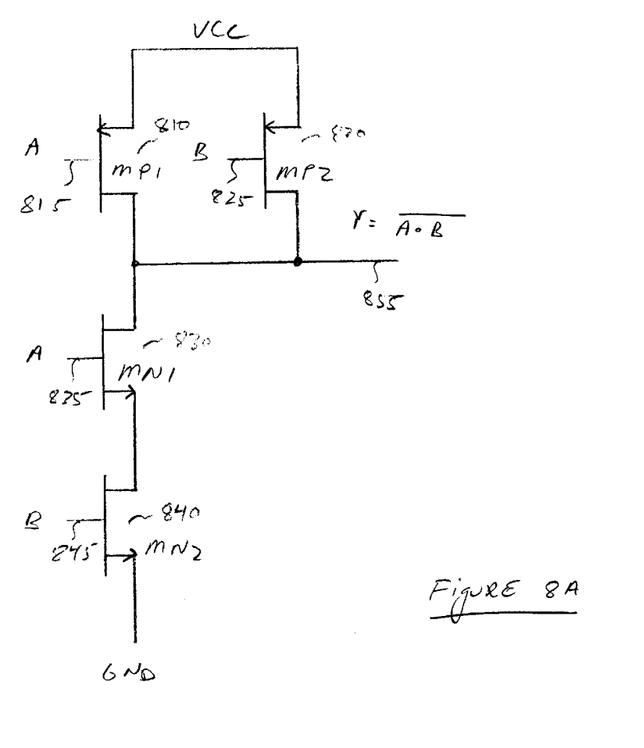
FIGS. 8A and 8B show two conventional transistor implementations of a NAND gate.

FIG. 8A shows a conventional two input NAND gate. An AND gate may be a composite of a NAND gate followed by an inverter. Inputs A and B are applied to the control terminals 815 and 825 of parallel p-channel devices 810 and 820, as well as the control terminals 835 and 845 of series n-channel devices 830 and 840. A and B typically alternate between a low or first voltage near ground and a high or second voltage near VCC. Only if both A and B are high, is output Y on line 855 low. If either A or B are low, then either MP1 820 or MP2 825 conduct, and the series path MN1 and MN2 appears open and non-conducting. In this case Y is pulled high to VCC.

Figure 8B:
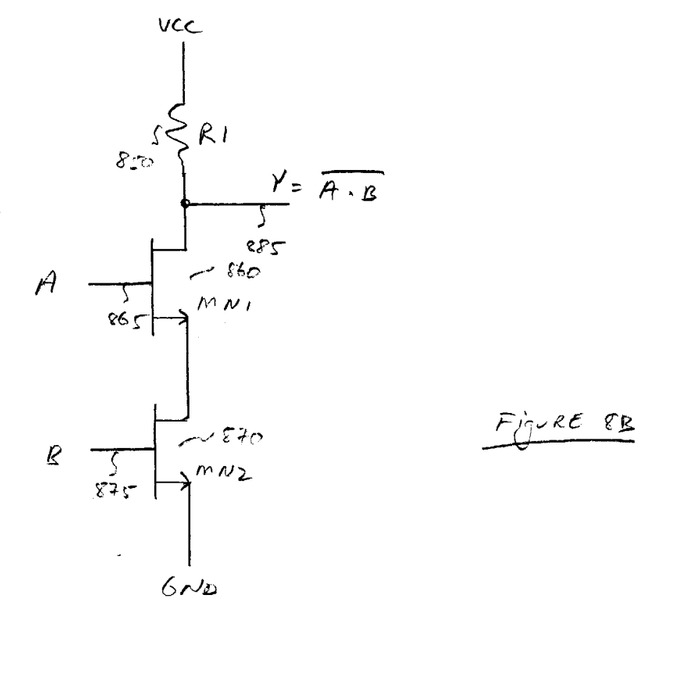

FIG. 8B illustrates an NAND gate where the p-channel devices MP1 810 and MP2 820 have been replaced by a resistor R1 850. Inputs A and B are applied to control terminals 865 and 875 of series n-channel devices 860 and 870. The resistor R1 850 is chosen to be in a range such that when A and B are high, the impedance from Y to ground (GND) is much less than R1, so that Y is pulled to ground. If either A or B are low, the series path MN1 860 and MN2 870 must be much higher than R1, so that Y is pulled to VCC. If there exists a DC current draw on line 885 due to a load, R1 must be reduced to prevent a large voltage drop from VCC to Y in the high state. A disadvantage as compared to the above arrangement is tat when A and B are high, there is a DC current equal to VCC divided by R1. In the circuit of FIG. 8A, there is no corresponding DC current.

Figure 9:
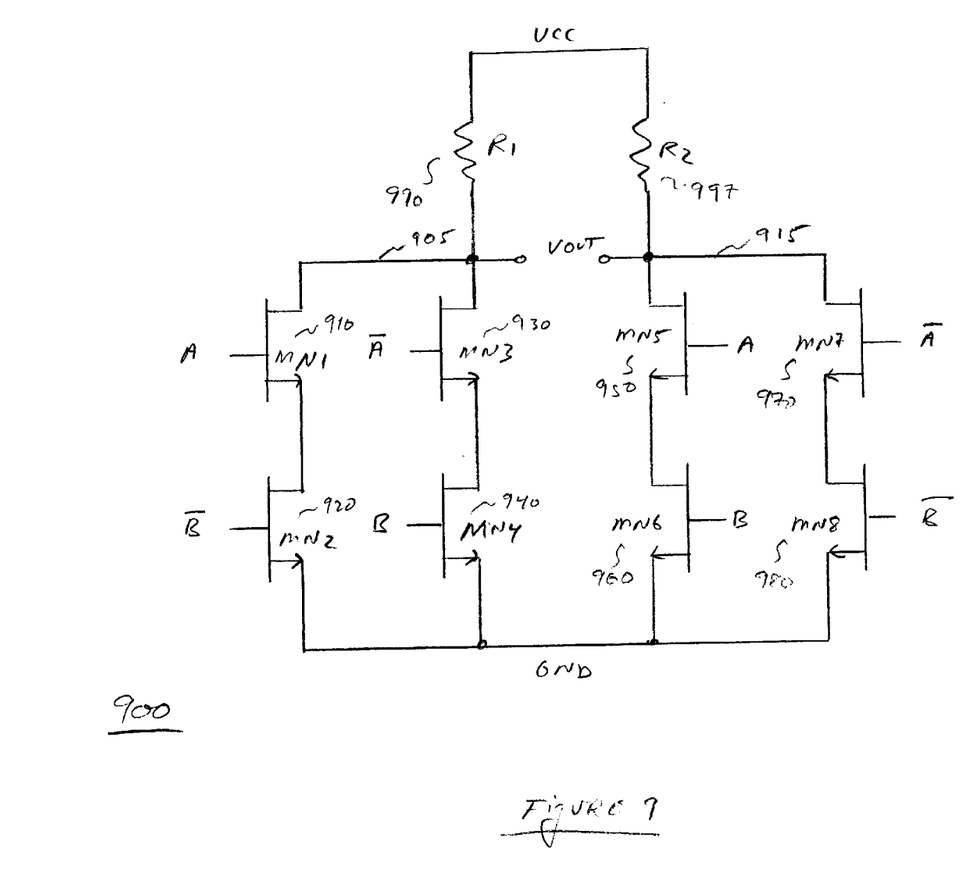
FIG. 9 depicts one implementation of an XOR gate with differential outputs.

FIG. 9 illustrates the circuit topology for a differential output XOR gate 900 consistent with one embodiment of the present invention. Each n-channel-series-path, such as MN1 910 and MN2 920, along with its corresponding resistor, such as R1 990, form a NAND gate. Each connection between the NAND gates, specifically nodes 905 and 915, forms an OR gate. In this way, the AND and OR gate configuration in FIG. 7, which implements the functions and equations in FIGS. 6A and 6B, is made using only 8 n-channel devices and two resistors. Resistors R1 990 and R2 997 are chosen the same way as R1 850 in FIG. 8B. That is, R1 990 is chosen to have a lower impedance than the parallel series structures MN1, MN2 and MN3, MN4 when those structures are off, and have a higher impedance when one is on.

The differential outputs appear at nodes 905 and 915. The signals on them alternate between two voltages, a first low voltage near ground, and a second high voltage near VCC. When the voltage on terminal 905 is high, the voltage on terminal 915 is low. When the voltage on terminal 905 is low, the voltage on terminal 915 is high.

Complete Mixer with XOR Core

Figure 10:
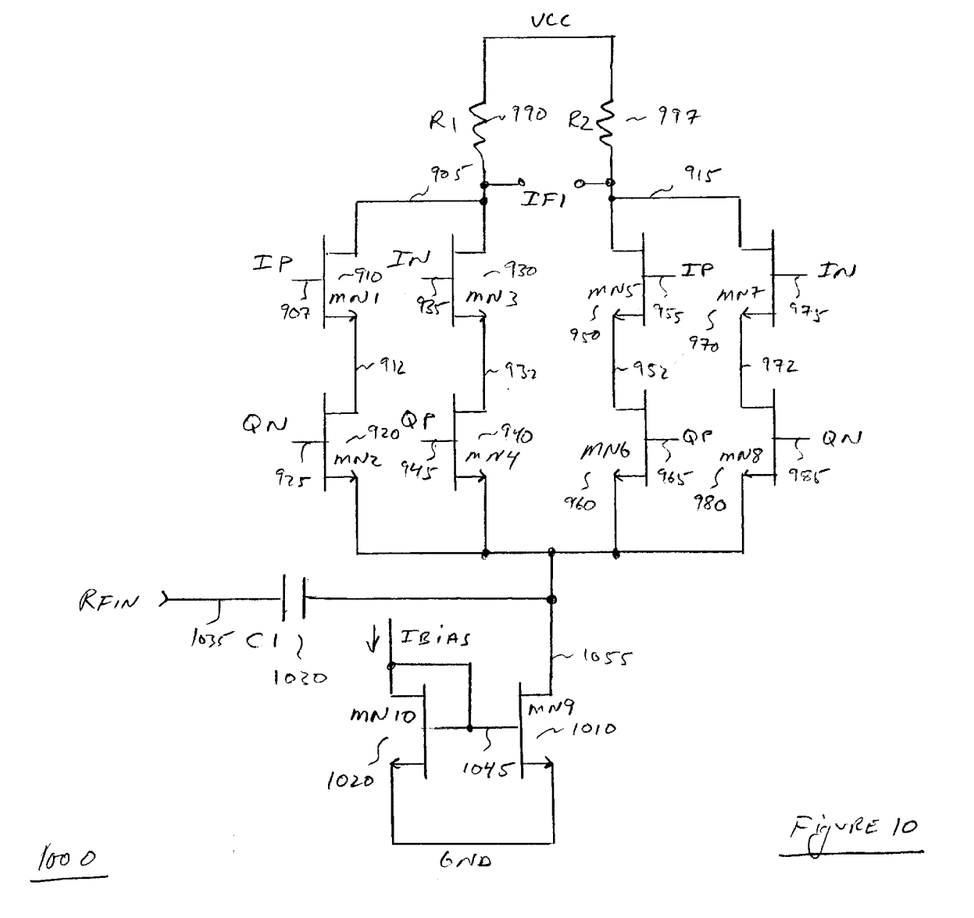
FIG. 10 is a mixer circuit consistent with an embodiment of the present invention.

FIG. 10 illustrates a multi-phase mixer 1000 for use in wireless receivers and transmitters. Mixer 1000 is also useful in image-reject upconverters and image-reject downconverters. In this circuit the XOR topology from FIG. 9 has been incorporated directly into the mixer itself. The mixer 1000 has a first input port I, which receives differential signals IP and IN. IP is coupled to the control nodes 907 and 955 of devices MN1 910, and MN5 950. IN is coupled to the control nodes 935 and 975 of devices MN3 930, and MN7 970.

The mixer has a second input port Q, which receives differential signals QP and QN. QP is coupled to the control nodes 945 and 965 of devices MN2 940, and MN8 960. QN is coupled to the control nodes 925 and 985 of devices MN1 920, and MN5 980. The mixer further has a third input port RFin 1035 coupled to capacitor C1 1030. A bias current is supplied to the mixer at Ibias 1045. This bias current generates a VGS voltage between the control and source electrodes of MN10 1020, which is applied between the control and source electrodes of MN9 1010. The VGS applied to MN9 1010 generates a current approximately equal to the bias current in MN10 1020.

The current generated in MN9 1010 is applied to the mixer core. A voltage signal at RFin is applied across the capacitor C1 1030. This generates a current in C1 which modulates the current from MN9 1010. For example, an increasing voltage at RFin generates a current from RFin through the capacitor Cl and into MN9's (1010) drain. This in turn reduces the current available to the mixer core. Alternately, a decreasing voltage at RFin generates a current from the mixer core through the capacitor C1 and into the voltage source driving RFin. This increases the current available to the mixer core.

The mixer core includes four NAND gates coupled together in groups of two, similar to that shown in FIG. 9. Specifically, MN1 910 and MN2 920 are serially coupled between nodes 905 and 1055. Node 1055 is the common return for all NAND gates. MN3 930 and MN4 940 are serially coupled between nodes 905 and 1055. M5 950 and MN6 960 are serially coupled between nodes 915 and 1055. MN7 970 and MN8 980 are serially coupled between nodes 915 and 1055. In order to save layout space and reduce stray capacitance, the common source-drain nodes 912, 932, 952, and 972 can be a common source-drain region with no contact being made to these areas.

The output port IF1 is between nodes 905 and 915. The connection at nodes 905 and 915 form OR-ties between two NAND gates. The output voltages appear across resistors R1 and R2. The resistors R1 and R2 are typically equal to each other. Each output node alternates between a first voltage and a second voltage. The signals on 905 and 915 are complementary; that is they are differential signals. When the signal on 905 is at the first voltage, the signal on 915 is at the second voltage. When the signal on 905 is at the second voltage, the signal on node 915 is at the first voltage. The second voltage is approximately VCC. The first voltage is less than VCC approximately by an amount which is the product of the current generated in MN9 1010 and the resistance of R1.

The transistors are shown as n-channel NMOS devices. But they may be p-channel devices, though the resistor loads would connect to ground, and the current generated by MN9 would come from VCC. Alternately, the transistors could be bipolar, gallium arsenide, or any other appropriate type device. Some or all the devices may be native. The resistors R1 and R2 may be p-diffusion material, p-implant material, polysilicon, or any other appropriate material. Resistors R1 and R2 may alternately be p-channel devices biased properly, for example in the triode region. The resistor values are chosen to give a desired output swing given the current Ibias in device MN10 1020. The devices' bulk connections are not shown, and typically are coupled to the ground node. Alternately, the devices' bulks may be tied to their sources or any other appropriate biasing point to achieve the desired device biasing.

The differential signal at the I port is skewed relative to the differential signal at the Q port. Typically the two are in quadrature- or nearly so- but this is not required. IP and IN are complementary signals, as are QP and QN. These signals are often sine waves, or at least waveforms with minimal spectral components outside the fundamental. Alternately, other spectral components may be higher, particularly the odd harmonics. Specifically, the waveforms may be square waves.

The direction of skew between the I and Q signals dictate the operational sequence for mixer 1000. For example, Q may follow I. Starting with I and Q both high, that is both IP and QP high, while IN and QN are low, currents flow from VCC, through R2 997, MN5 950, MN6 960, and into the current source formed by MN9 1010 and the capacitor C1 1030. Since I leads, IP returns low, and IN high. Now current flows from VCC though R1 990, MN3 930, MN4 940, and into the current source.

Next, Q changes, IP and QP are low, IN and QN are high. Current flows from VCC through R2 997, MN7 970, and MN8 980 to the current source. I changes, IP is high, IN returns low, and current flows from VCC though R1, MN1 910, MN2 920 to the current source. Lastly, Q changes, IP and QP are high, which was the original starting state.

The frequency doubling effect can be seen since when I is high the current alternates between R1 990 and R2 997 once. Similarly, when I is low, the current alternates between R1 990 and R2 997 one time. This means that the mixer core doubles the I signal's frequency. In this way, the VCO frequency is doubled.

The voltages on lines IP, IN, QP, and QN may switch between a level near VCC and a level near ground. Also, they may have a lower amplitude, and alternate between a voltage below VCC and a voltage above ground. The signals may go below ground or above VCC, for example, if gain peaking is used, or the driving circuits have a different power supply. Switching performance may be improved if the voltage levels applied to the control electrodes of the top devices are higher than the voltage levels applied to the control electrodes of the bottom devices. An exemplary embodiment of the present invention applies a sinusoidal voltage waveform to the top devices having a minimum and maximum voltages of 1.2 and 1.8 volts, and a sinusoidal voltage waveform to the bottom devices that ranges between 0.9 and 1.5 volts nominally. This biases the conducting devices and current source near the saturation region, enhancing circuit performance. The applied waveforms may be sinusoids, square waves, gausssian-filtered square waves, ramps, or any other switching waveform.

Figure 11:
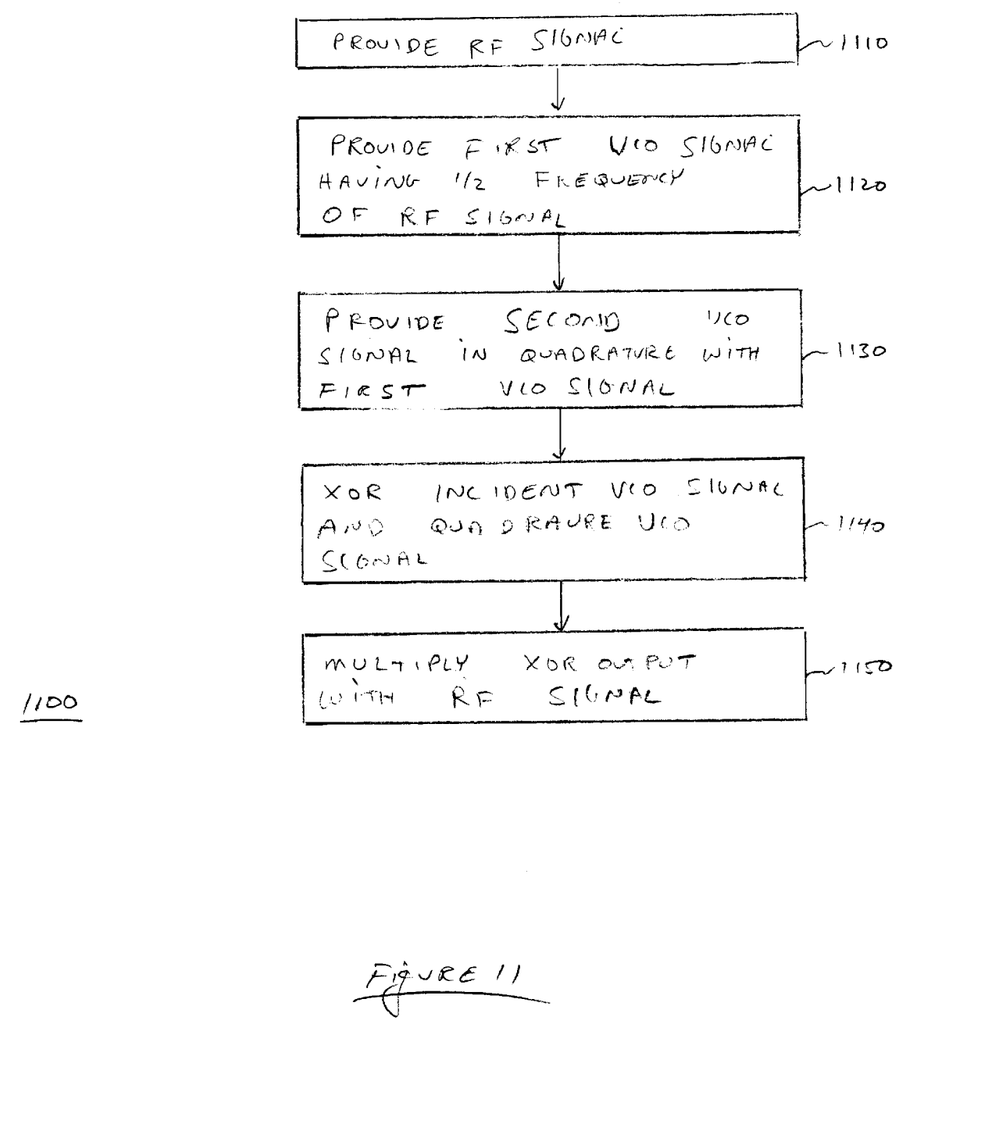
FIG. 11 illustrates a flow chart for mixing signals in a manner consistent with the present invention.

FIG. 11 illustrates a flow chart for a method 1100 of mixing signals in a manner consistent with one embodiment of the present invention. An RF signal having a first frequency is provided in act 1110. A first signal having a second frequency is provided by a VCO in act 1120. The first signal has a frequency which is roughly half of the RF signal frequency. That is, the second frequency is about half the first. A second signal is provided by a VCO in act 1130. The second signal is in quadrature with the first signal. That is, it is delayed from the first signal by approximately 90 degrees and has the same fundamental frequency.

The first and second signals are XORed together in act 1140. While the signals are being XORed, they are also multiplied by the RF signal in act 1150. In this way an output having a third frequency equal to the first frequency less twice the second frequency is generated by the mixer. The third frequency may be very near DC. For example the third frequency may be in the range between 500 kHz to 1500 kHz. Alternately the third frequency may be at a higher IF, such as 24 MHz, or 110 MHz. The acts shown may be done in almost any order. For example, the sequence in which the signals are provided is immaterial. Also, the XORing and multiplying in acts 1140 and 1150 may be done in one step, or two separate steps.

The exemplary embodiments of the present invention are illustrative and not limiting. The invention is not limited by the exact configuration shown in any of the figures. Other variations of the present invention are obvious in light of the above, and will be apparent to those skilled in the art. For example, other devices such as bipolar or gallium arsenide transistors may be used in equivalent or similar structures without departing from the spirit and scope of the present invention. These equivalents and alternatives, along with obvious changes and modifications, are intended to fall within the scope of the appended claims.

What is claimed is:

1. A wireless receiver apparatus comprising:
   a voltage controller oscillator for generating a first signal having a first frequency, and a second signal having the first frequency and in quadrature with the first signal; and
   a mixer having a first input port for receiving the first signal, and a second input port for receiving the second signal, a third input port for receiving a third signal centered about a third frequency,
   wherein the mixer generates a fourth signal having a frequency centered about the third frequency less device the first frequency and comprises an exclusive-OR gate,
   the exclusive-OR gate comprising:
      a first n-channel device coupled between a first output node and a fourth node;
      a second n-channel device coupled between the fourth node and a third node;
      a third n-channel device coupled between the first output node and a fifth node;
      a fourth n-channel device coupled between the fifth node and the third node;
      a fifth n-channel device coupled between a second output node and a sixth node;
      a sixth n-channel device coupled between the sixth node and the third node;
      a seventh n-channel device coupled between the second output node and a seventh node; and
      a eighth n-channel device coupled between the seventh node and the third node.

2. The apparatus of claim 1 wherein the first and second signals are differential signals having true and complement signal portions.

3. The apparatus of claim 1 wherein the exclusive-OR gate is comprised of NAND gates and OR gates.

4. The apparatus of claim 2 wherein the first and second n-channel devices, the third and fourth n-channel devices the fifth and sixth n-channel devices, and the seventh and eighth n-channel devices operate as NAND gates and the first and second output nodes operates as OR gates.

5. The apparatus of claim 4 wherein the mixer further comprises a capacitor coupled to the third input.

6. The apparatus of claim 1 further comprising a current source coupled between the third node and ground.

7. The apparatus of claim 6 wherein
   the true portion of the first signal couples to the control electrodes of the first and fifth n-channel devices;
   the complement portion of the first signal couples to the control electrodes of the third and seventh n-channel devices;
   the true portion of the second signal couples to the control electrodes of the fourth and sixth n-channel devices; and
   the complement portion of the second signal couples to the control electrodes of the second and eight n-channel devices.

* * * * *